(12) United States Patent
Cheek

(10) Patent No.: US 6,254,719 B1
(45) Date of Patent: Jul. 3, 2001

(54) METHOD FOR CONTROLLED REMOVAL OF MATERIAL FROM A SOLID SURFACE

(75) Inventor: Roger W. Cheek, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/416,999

(22) Filed: Oct. 13, 1999

Related U.S. Application Data

(62) Division of application No. 08/953,478, filed on Oct. 17, 1997, now Pat. No. 6,022,485.

(51) Int. Cl.⁷ .............................. H01L 21/302; C23F 1/02
(52) U.S. Cl. .................... 156/345; 204/224 M; 204/225; 204/298.31
(58) Field of Search ....................... 156/345; 204/224 M, 204/225, 298.31

(56) References Cited

U.S. PATENT DOCUMENTS

| | | |
|---|---|---|
| 3,785,862 | 1/1974 | Grill . |
| 4,127,437 | 11/1978 | Bersin et al. . |
| 4,466,859 | 8/1984 | Nelson . |
| 4,506,005 | 3/1985 | Lis . |
| 4,582,581 | 4/1986 | Flanigan et al. . |
| 4,968,552 | 11/1990 | Linde . |
| 5,032,216 | 7/1991 | Felten . |
| 5,135,607 | 8/1992 | Hirai . |
| 5,196,089 | 3/1993 | Takada et al. . |
| 5,328,550 | 7/1994 | Graebner et al. . |
| 5,680,008 | 10/1997 | Brandes et al. . |
| 5,713,775 | 2/1998 | Geis et al. . |
| 5,780,363 | * 7/1998 | Delehanty et al. .................. 438/748 |
| 6,008,136 | * 12/1999 | Wada .................................. 438/723 |
| 6,022,485 | * 2/2000 | Cheek ................................... 216/75 |
| 6,031,289 | * 2/2000 | Fulford, Jr. et al. ................. 257/758 |

FOREIGN PATENT DOCUMENTS

| | | |
|---|---|---|
| 50-62827 | 5/1975 | (JP) . |
| 52-022598 | 2/1977 | (JP) . |
| 52-127767 | * 10/1977 | (JP) . |
| 63-121678 | 5/1988 | (JP) . |
| 1-153555 | 6/1989 | (JP) . |
| 7-193054 | 7/1995 | (JP) . |
| 8-153879 | 6/1996 | (JP) . |
| 9-260246 | 10/1997 | (JP) . |
| 726214 | 4/1980 | (SU) . |

OTHER PUBLICATIONS

Amirov, et al., "Catalytic Etching of Silicon In a Plasma Containing Fluorine," Soviet Tech. Phys. Lett., vol. 17, No. 2, pp. 151–152 (Feb. 1991).

Selamoghu, et al., "Catalyzed Gaseous Etching of Silicon," J. Appl. Phys., vol. 62, No. 3, pp. 1049–1053 (1987).

* cited by examiner

*Primary Examiner*—Gregory Mills
*Assistant Examiner*—George Goudreau
(74) *Attorney, Agent, or Firm*—Scully, Scott, Murphy & Presser; Eugene I. Shkurko

(57) ABSTRACT

A catalytic method and an apparatus for selectively removing material from a solid substrate is provided. The method comprises contacting a surface of a solid substrate with a catalyst material in the presence of a reactant under conditions effective to selectively remove material from those areas of said solid substrate in contact with said catalyst material and said reactant.

6 Claims, 3 Drawing Sheets

METHOD FOR CONTROLLED REMOVAL OF MATERIAL FROM A SOLID SURFACE

RELATED APPLICATIONS

Figure 1A:
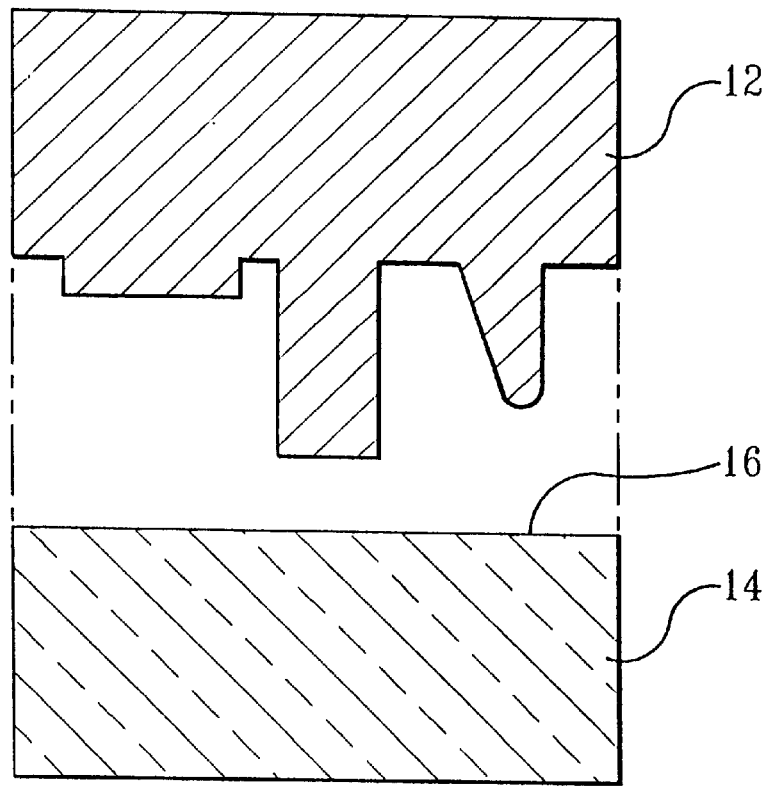

This application is a divisional of U.S. application Ser. No. 08/953,478 filed Oct. 17, 1997, now U.S. Pat. No. 6,022,485.

FIELD OF THE INVENTION

The present invention relates broadly to microelectronics, micromachinery or optics and, in particular, to a geometrically controlled catalytic method wherein removal of material from a solid substrate is carried out without the need of using conventional photolithographic processes The geometrically controlled catalytic removal method of the present invention is particularly useful in providing a pattern such as a deep trench capacitor and a shallow trench isolation region to a semiconductor substrate in a single processing step. In prior art processes, multiple photolithographic and etching steps are required to produce such a pattern in a semiconductor substrate. Additionally, complex shapes may be formed, possibly providing design advantages over the simple geometries of current photolithography/etch processes.

BACKGROUND OF THE INVENTION

In the field of semiconductor manufacturing, it is well known that a pattern can be formed in a surface of a solid substrate by utilizing conventional photolithographic techniques. Conventional photolithographic processes include the steps of providing a photoresist or mask to predetermined areas of a solid substrate, patterning said photoresist or mask, etching the exposed areas of the solid substrate and stripping of the photoresist or mask. In such prior art processes, etching of the solid substrate is generally achieved by employing either a wet etch or a dry etch.

Wet etching is carried out using a chemical etchant which is highly selective for the particular solid substrate being etched. A major problem with wet etching is that an undercut often times develops on each edge of the photoresist. This property of undercutting the photoresist makes it impossible to achieve sub-tenth micrometer geometry reproducibly. Moreover, in order to etch a pattern into a solid substrate having multiple depths, repeated wet etching steps are required.

In the case of dry etching, ion beam etching (IBE) and reactive ion etching (RIE) are known in the art. These dry etching techniques are both line-of-sight etching processes and are able to produce higher resolution patterns with tighter dimensional control. Despite this, each of these dry etching techniques suffer from unique problems.

A major problem associated with IBE is that the edges of all features of the photoresist are etched at a faster rate due to a high flux of incident ions. This phenomenon is caused by the reflection of bombarding ions off the side walls of the photoresist. The above property associated with IBE is referred to in the art as "trenching" and it typically causes roughening at the edges of the etched features.

The problem generally encountered using RIE is the formation of tall, narrow pedestals of unetched material at the bottom of the pattern feature. This phenomenon which is referred to in the art as "grassing" is caused by localized masking of the photoresist during RIE. Such pedestals may be removed by utilizing a wet etch process.

In view of the drawbacks mentioned hereinabove, prior art etching processes (dry and wet etching alike) are incapable of providing geometrically controlled removal of material from a solid substrate. Moreover, multiple etching steps are generally required to produce a pattern in a solid substrate that has varying depths. Additionally, many complex geometries, such as curved or angled surfaces, are difficult or even impossible to create using existing prior art methods. Thus, there remains a need for developing a method for providing geometrically controlled removal of material from a solid substrate whereby patterning of the solid substrate is achieved without using prior art photolithographic processes. Moreover, there is also a need for developing a method wherein a pattern having different depths is produced in a solid substrate utilizing a single step replacing the multiple photolithographic steps required by the prior art to obtain the same pattern.

SUMMARY OF THE INVENTION

One object of the present invention is to provide a method of selectively removing material from a solid substrate wherein a pattern or planarized surface is produced.

Another object of the present invention is to provide a geometrically controlled removal method that is a replacement for prior art etching or planarization methods and which overcomes all of the aforementioned problems associated with such prior art techniques.

A further object of the present is to provide a catalytically induced method which is highly effective in removing material from a solid substrate to form a desired three-dimensional or planar pattern in the solid substrate.

These as well as other objects are achieved by the method of the present invention wherein a geometrically controlled pattern is formed in a solid substrate utilizing a catalyst material and a reactant. Specifically, the method of the present invention comprises contacting a surface of a solid substrate with a catalyst material in the presence of a reactant under conditions effective to remove material from those areas of said solid substrate in contact with said catalyst material and said reactant, wherein at least one of said catalyst material or said reactant is a solid.

In accordance with a preferred embodiment of the present invention, silicon or $SiO_2$ represent the solid substrate, W is the catalyst material and fluorine atoms represent the reactant.

As stated above, the instant invention utilizes a catalyst material and a reactant to effectively and selectively remove material from a solid substrate. Generally, the catalyst material is a solid and the product of the reaction between the reactant and the solid substrate is mobile, i.e. gas or liquid, thereby facilitating the removal of areas of said solid substrate in contact with said catalyst material and said reactant. It is noted that since two of the species in the catalytic reaction are solids, the catalytic reaction of the present invention occurs only in those areas wherein the two solids are in contact. No sufficient removal of material from the solid substrate occurs in areas which do not contain either the reactant or catalyst material. A reaction between the reactant and solid substrate may proceed without the catalyst material, but it is slow and thus would not result in any significant removal of material from the solid substrate using the conditions employed in the present invention.

Another aspect of the present invention relates to an apparatus for the controlled removal of material from a solid substrate. In accordance with this aspect of the present invention, the apparatus comprises: a catalyst material; a reactant; a solid substrate; and a means for contacting said catalyst material with said solid substrate in the presence of said reactant.

DETAILED DESCRIPTION OF THE DRAWINGS

Figure 1B:
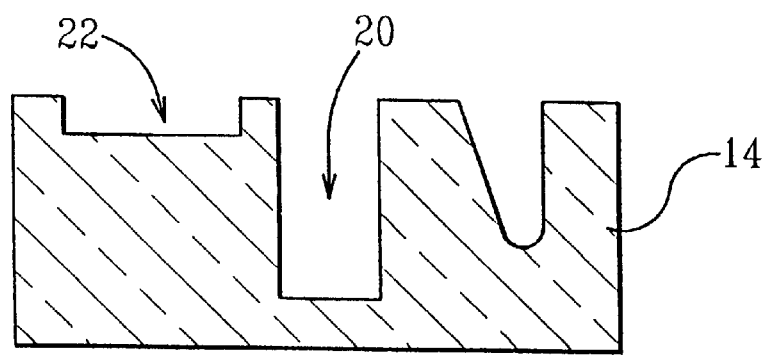

FIGS. 1(a)–1(b) are cross-sectional views illustrating one of the catalytic induced removal methods of the present invention: (a) prior to contacting, and (b) after contacting with a non-supported solid catalyst material.

Figure 2:
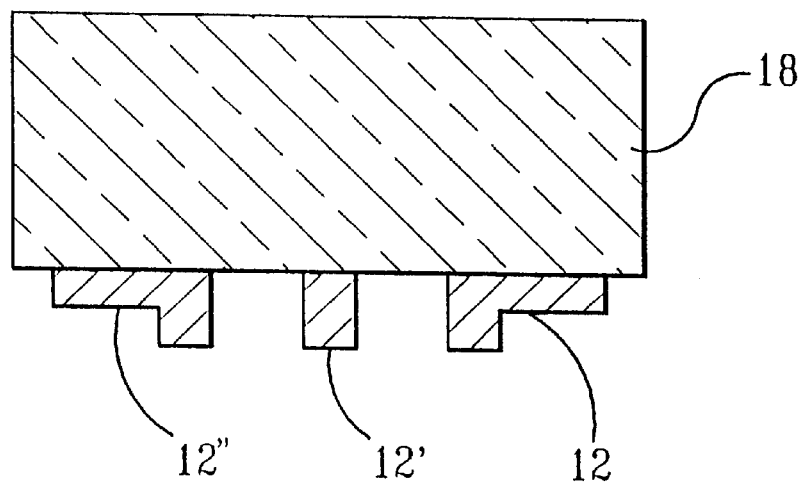
Figure 3:
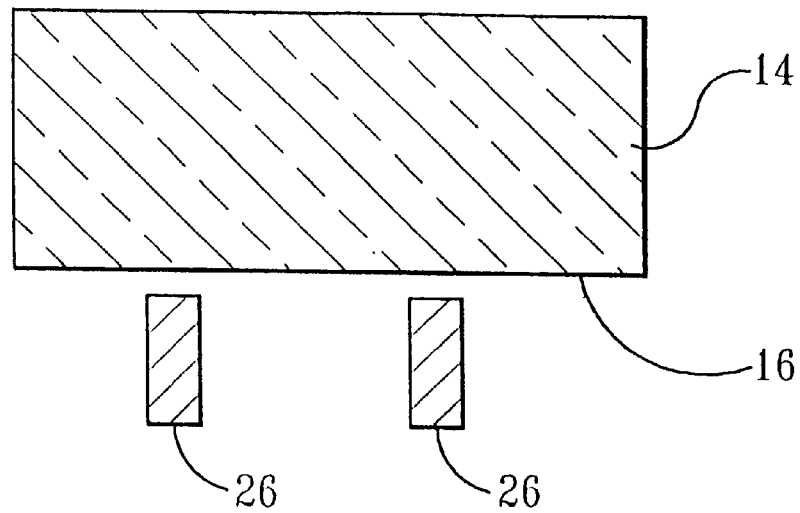

FIG. 2 is a cross-sectional view of an alternate embodiment of the present invention wherein the catalyst material is supported on an inert support material FIG. 3 is a cross-sectional view of another alternate embodiment of the present invention wherein isolated catalyst particles are brought into contact with a surface of a solid substrate.

Figure 4A:
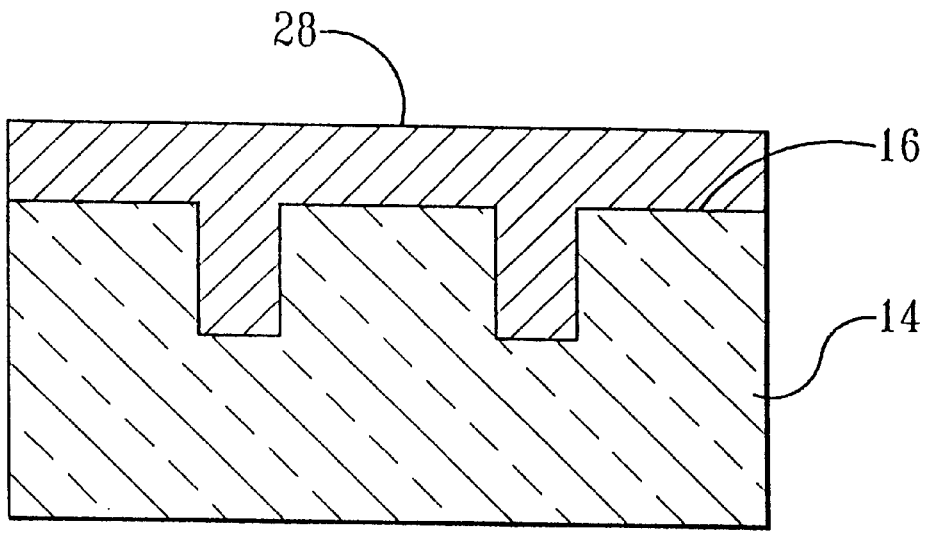
Figure 4B:
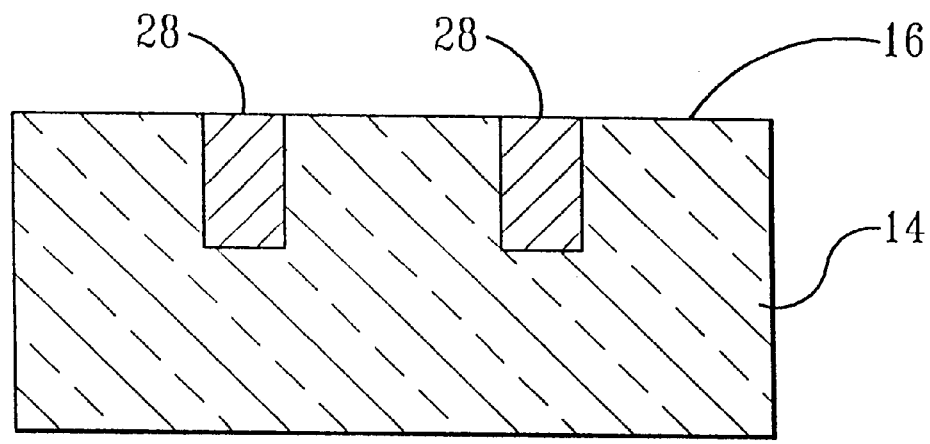

FIGS. 4(a)–4(b) are cross-sectional views of a solid substrate having a metal layer deposited on the substrate: (a) prior to contacting with a catalyst material and a reactant; and (b) after contacting with a catalyst material and a reactant.

DETAILED DESCRIPTION OF THE PRESENT INVENTION

The present invention which provides a method and an apparatus for geometrically controlled catalytic removal of material from a solid substrate will now be described in more detail with reference to the accompanying drawings wherein like reference numerals are used for like and corresponding elements of the drawings. It is noted that each of the accompanying drawings represent various embodiments of the present invention which will be described in greater detail hereinbelow.

In all these embodiments, a solid catalyst material and a mobile reactant (liquid or gas) are used to selectively remove portions of a solid substrate that are in contact with said solid catalyst material and said mobile reactant. The result is the transfer of the three-dimensional shape of the solid catalyst material to the solid substrate.

Referring first to FIGS. 1(a)–(b), there are shown the first embodiment of the present invention wherein the instant method is used to provide a semiconductor material having a deep trench capacitor region and a shallower trench isolation region. Specifically, in FIG. 1(a), there is shown a catalyst material 12 containing a preformed three-dimensional pattern on one of its surfaces and a solid substrate 14 having a surface 16.

The solid substrates employed in the present invention are materials which can be catalytically removed using a catalyst material and a reactant. Suitable solid substrates which can be employed in the present invention include: semiconductor materials such as silicon, germanium, gallium, arsenic, indium and mixtures thereof, and dielectric materials such as $SiO_2$, diamond, $Si_3N_4$, diamond-like carbon, fluorinated oxides, aerogels, polymers and the like. Also contemplated are other dielectrics that have a resistivity value lower than $SiO_2$. Highly preferred materials for solid substrate 14 are silicon and $SiO_2$.

Catalyst material 12 contains at least one metal selected from Group IVB, VB, VIB, VIIB and VIII of the Periodic Table of Elements (CAS version). Illustrative examples of such metals that can be employed in the present invention include: Ti, Zr, Hf, V, Ta, Cr, Mo, W, Mn, Fe, Co, Ni, Ru, Rh, Pd and the like. Mixtures or alloys of these metals are also contemplated herein. A highly preferred metal employed in the present invention is W.

In accordance with the present invention, catalyst material 12 may be unsupported (as shown in FIG. 1(a)), supported (as shown in FIG. 2) or used as isolated particles (as shown in FIG. 3).

When supported, catalyst material 12 is supported on an inert support material 18. Suitable inert support materials employed in the present invention include, but are not limited to: glass, inert metals and inert polymers. A highly Preferred inert support material employed in the present invention is glass.

The catalyst material may be preformed in the desired three dimensional pattern, or it can be deposited onto an inert support material containing the desired three-dimensional pattern using conventional means well known to those skilled in the art. For example, the desired pattern can be formed by chemical vapor deposition, sputtering and like thereof. In one embodiment of the present invention, the geometry of the catalyst material may be a flat plane, thereby planarizing the surface of the solid substrate it comes in contact with. This embodiment may provide a useful alternative to chemical-mechanical polishing (CMP) or other planarization techniques.

In accordance with the present invention, surface 16 of solid substrate 14 is brought into contact with the patterned surface of catalyst material 12 in the presence of a reactant under conditions effective to selectively remove those areas of the surface of the solid substrate in contact with the catalyst material and the reactant.

The term "reactant" is used herein to denote a solid, liquid or gaseous etchant material. The term "mobile reactant" is used herein to denote a liquid or gaseous etchant material. Suitable etchants include chlorine atoms, oxygen atoms, fluorine atoms and the like. Mixtures of these atoms are also contemplated herein. A highly preferred reactant employed in the instant invention is fluorine atoms which are derived from $WF_6$ gas. It is noted that when the reactant is a solid, the catalyst material may be a liquid or gas. That aspect of the present invention will be discussed in greater detail hereinbelow.

The conditions employed in the present invention to effectively remove portions of the solid substrate may vary over a wide range, but generally the conditions are as follows: Temperature is from about 350° to about 450° C., pressure is from about 0.5 to about 1 psig, time is from about 1 to about 20 seconds; and reactant partial pressure is from about 0.005 to about 0.01 psig.

After carrying out the contacting step in the above described manner, a geometrically etched pattern is formed in the surface of the solid substrate. Specifically, as is shown in FIG. 1(b), solid substrate 14 having a deep trench region 20 and a shallower trench region 22 is formed utilizing the single reaction step of the present invention. Other structures containing a number of different three-dimensional patterns having varying depths and configurations can be formed by the method of the present invention. As stated above, the present method represents a viable replacement for conventional lithographic processes.

Referring again to FIG. 2, there is shown a second embodiment of the present invention wherein catalyst material 12 is supported on an inert support material 18. In this figure, the catalytic template includes isolated catalyst material 12, 12' and 12" respectively, on inert support material 18. When such a template is used in the method of the present invention, the removal process does not occur in those areas wherein the catalyst material is not present on the inert support material. The reaction conditions using this aspect of the present invention are the same as those mentioned hereinabove. In addition to the embodiment shown in FIG. 2, the catalyst material may be supported over the entire surface of inert support material 18 that has a three-dimensional pattern.

FIG. 3 shows another embodiment of the present invention wherein isolated catalyst particles 26 and 26" are used to create wormholes or moleholes in solid substrate 14. The catalyst particles contain the same metals as described for catalyst material 12. Again, material from solid substrate 14 is removed only in those areas wherein the catalyst particles and the reactant come in contact with the surface of solid substrate 14. No removal of material occurs in areas wherein the catalyst particles are not present.

As is known to those skilled in the art wormholes are very small diameter tubes (hundreds of A extending up to microns) formed through a solid material such as silicon. Moleholes are different from wormholes in that they have a much larger diameter which is in the order of about 0.05 to about 0.5 micrometers. In both of these defects, a particle is observed to be present at the end of the tube. In the case of wormholes, the particle is usually W, whereas in moleholes the particle is a titanium silicide agglomerate.

FIGS. 4(a)–(b) illustrate a planarization embodiment of the present invention. In FIG. 4(a), solid substrate 14 has a metal layer 28 deposited thereon. Preferred metals for layer 28 are W or Cu. FIG. 4(a) represents a structure prior to contact with said catalyst material and said reactant, whereas FIG. 4(b) represents the structure after contact with said catalyst material and said reactant. As shown in these figures, the present invention can be used as an alternative to chemical-mechanical polishing. Specifically, the method of the present invention can be used to planarize metal layer 28 providing the structure shown in FIG. 4(b). In this embodiment, metal layer 28 is removed using a catalyst material having a planarized surface.

Although the invention has been described as using a solid catalyst material, it is also possible that the catalyst material is mobile, i.e. a liquid or a gas. When a mobile gas or liquid is employed as the catalyst material, the reactant is in solid form and is shaped in accordance with the desired three-dimensional pattern to be formed in the solid substrate. Such a template would result in different shapes because the solid reactant would be consumed resulting in structures of decreasing dimension as depth increases. This embodiment would also mean that the etchant template could only be used a number of times before it is completely consumed. When this embodiment is employed, the removal of material from the solid substrate still occurs in areas wherein the solid substrate is in contact with the mobile catalyst and the solid reactant.

When the catalyst material is mobile and the reactant is a solid, the conditions employed to selectively remove areas of the solid substrate are the same as those mentioned hereinabove.

In accordance with another aspect of the present invention, an apparatus including a surface of a solid substrate, a catalyst material and a reactant is also provided. Specifically, the apparatus of the present invention includes means for contacting the surface of said solid substrate with said catalyst material in the presence of said reactant An illustrative example of a specific means for contacting said solid substrate and said catalyst material is by utilizing a piezoelectronic positioner. Other means for said contacting include a robot arm, a vise, and the like.

As stated above, the method of the present invention provides a geometrically controlled means for forming a desired pattern in a solid substrate The pattern is formed without the need of using conventional photolithographic techniques. Thus, the present invention represents a significant advancement in the field of microelectronics. Moreover, patterns having varying depths in a solid substrate can be achieved in a single step when the method of the present invention is employed. In addition, patterns having complex shapes, such as curves and angled surfaces, may be produced. Moreover, the catalyst material may have a planar configuration which, when employed in the present invention, would planarize the solid substrate, or provide for blanket removal of the solid substrate material.

While the invention has been particularly described with respect to preferred embodiments thereof, it will be understood by those skilled in the art that the foregoing and other changes in form and detail may be made without departing from the scope and spirit of the invention.

What is claimed is:

1. An apparatus for fabricating a geometrically controlled pattern in a solid substrate comprising:
a surface of a solid substrate, said substrate does not contain a photoresist thereon;
a surface of a solid, separately supported catalyst material, said catalyst having a geometric pattern on one of its surfaces;
a reactant; and
means for contacting said surface of said solid substrate with said catalyst material in the presence of said reactant.

2. The apparatus of claim 1 wherein said means for contacting employs the use of a piezoelectric positioner.

3. The apparatus of claim 1 wherein said catalyst material is solid tungsten, said solid substrate is silicon or $SiO_2$ and said reactant is a gas comprising fluorine atoms.

4. The apparatus of claim 1 wherein said means for contacting employs the use of a robot arm.

5. The apparatus of claim 1 wherein said means for contacting employs the use of a vise.

6. An apparatus for fabricating a geometrically controlled pattern in a solid substrate comprising:
a surface of a solid substrate, said substrate does not contain a photoresist thereon;
a surface of a catalyst material;
a solid reactant, said solid reactant having a geometric pattern on one of its surfaces; and
means for contacting said surface of said solid substrate with said catalyst material in the presence of said reactant.

* * * * *

UNITED STATES PATENT AND TRADEMARK OFFICE
CERTIFICATE OF CORRECTION

PATENT NO. : 6,254,719 B1
DATED : July 3, 2001
INVENTOR(S) : Roger W. Cheek

Page 1 of 1

It is certified that error appears in the above-identified patent and that said Letters Patent is hereby corrected as shown below:

Column 5,
Line 11, "A" should read -- Å --

Column 6,
Line 8, "substrate The" should read -- substrate. The --

Signed and Sealed this

Thirtieth Day of April, 2002

Attest:

*Attesting Officer*

JAMES E. ROGAN
*Director of the United States Patent and Trademark Office*